(12) United States Patent
Ladru et al.

(10) Patent No.: US 8,123,464 B2
(45) Date of Patent: Feb. 28, 2012

(54) COATING OPTIMIZATION PROCESS USING A COUPON AND COMPONENT COMPRISING A COUPON

(75) Inventors: Francis-Jurjen Ladru, Berlin (DE); Ralf Motzkus, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 491 days.

(21) Appl. No.: 12/312,055

(22) PCT Filed: Oct. 23, 2006

(86) PCT No.: PCT/EP2006/067659
§ 371 (c)(1),
(2), (4) Date: Apr. 23, 2009

(87) PCT Pub. No.: WO2008/049456
PCT Pub. Date: May 2, 2008

(65) Prior Publication Data
US 2010/0061864 A1   Mar. 11, 2010

(51) Int. Cl.
*F01D 5/18* (2006.01)
(52) U.S. Cl. ....... 415/115; 415/116; 415/191; 416/96 R; 416/97 R; 416/224; 416/241 R
(58) Field of Classification Search .................. 415/115, 415/191, 200; 416/96 R, 97 R, 223 A, 224, 416/229 A, 230, 241 R, 248
See application file for complete search history.

(56) References Cited

U.S. PATENT DOCUMENTS

| 5,403,153 | A | * | 4/1995 | Goetze .................. 416/229 A |
| 6,024,792 | A | | 2/2000 | Kurz et al. |
| 7,393,183 | B2 | * | 7/2008 | Keller ........................ 416/224 |
| 2003/0082048 | A1 | * | 5/2003 | Jackson et al. .............. 415/115 |
| 2011/0158820 | A1 | * | 6/2011 | Chamberlain et al. ...... 416/97 R |

FOREIGN PATENT DOCUMENTS

| EP | 0412397 A1 | 2/1991 |
| EP | 0486489 B1 | 5/1992 |
| EP | 0786017 B1 | 7/1997 |
| EP | 892090 A1 | 1/1999 |
| EP | 1072692 A2 | 1/2001 |
| EP | 1074331 A1 | 2/2001 |
| EP | 1204776 B1 | 5/2002 |
| EP | 1306454 A1 | 5/2003 |
| EP | 1319729 A1 | 6/2003 |
| JP | 59000502 A | 1/1984 |
| WO | WO 9967435 A1 | 12/1999 |
| WO | WO 0044949 A1 | 8/2000 |

* cited by examiner

*Primary Examiner* — Michael Lebentritt

(57) ABSTRACT

A method for optimizing the coating of a component using a coupon by introducing the coupon into a depression of the component, in which the geometry of the component is not altered as compared to a component without a coupon, is provided. A component having a depression into which a coupon is fastened is also provided.

20 Claims, 4 Drawing Sheets

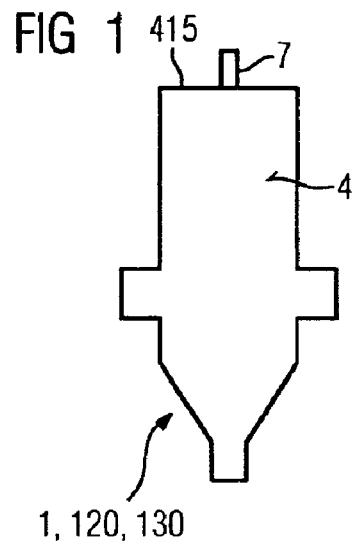
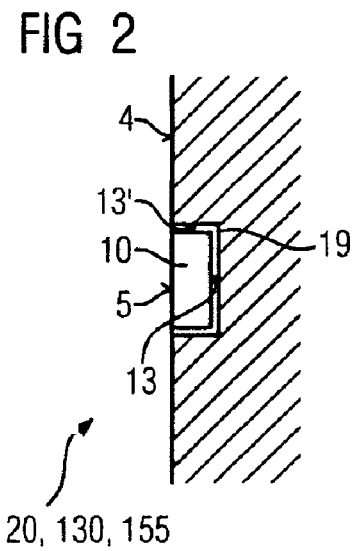
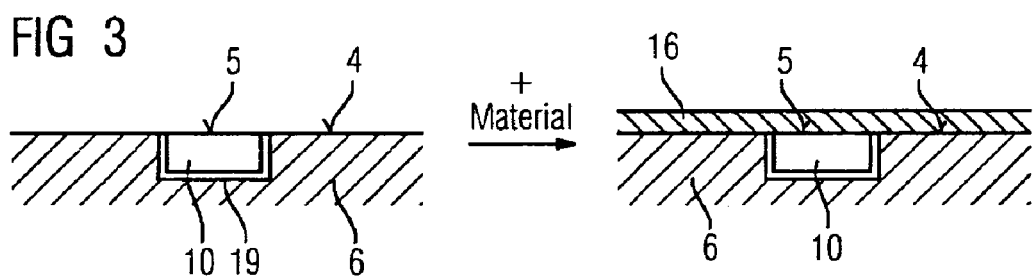
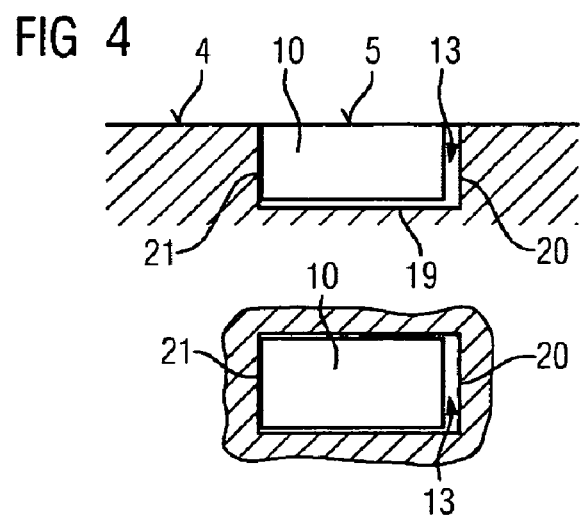

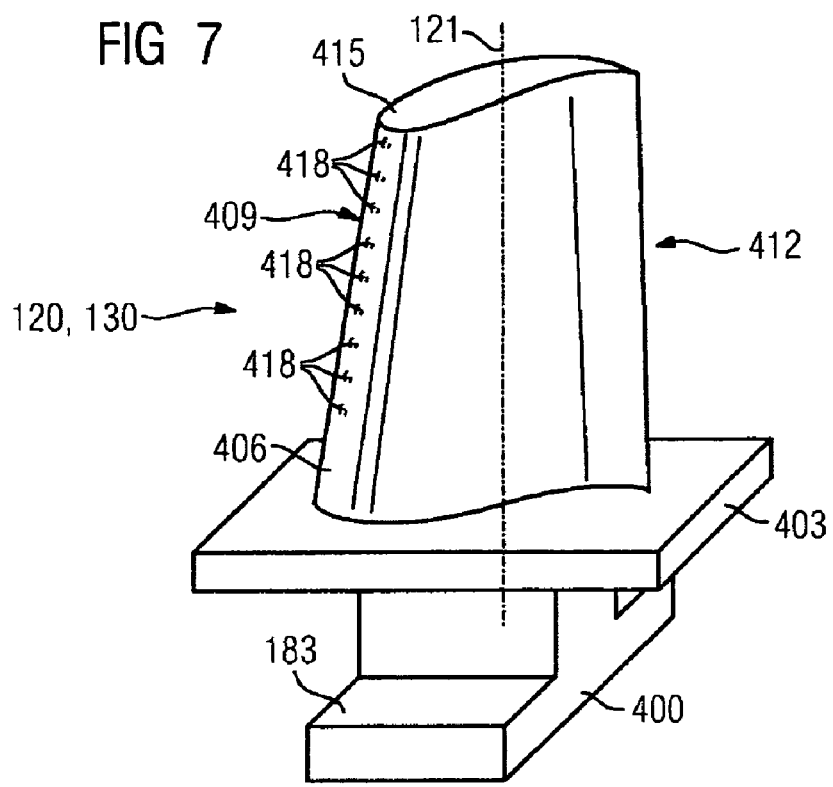
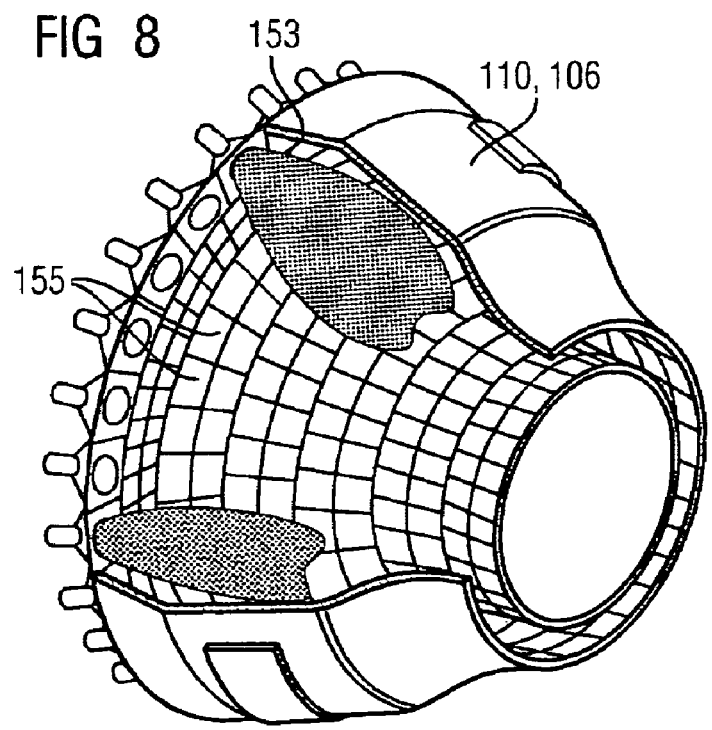

COATING OPTIMIZATION PROCESS USING A COUPON AND COMPONENT COMPRISING A COUPON

CROSS REFERENCE TO RELATED APPLICATIONS

This application is the US National Stage of International Application No. PCT/EP2006/067659, filed Oct. 23, 2006 and claims the benefit thereof.

FIELD OF INVENTION

The invention relates to a method for optimizing the coating of a component, in which coupons are used, and to a component.

BACKGROUND OF INVENTION

Components which are used in corrosive surroundings or hot surroundings often have layers which improve the corrosion protection or only allow use at higher temperatures. This applies, for example, to components of turbines in aircraft or turbines for the stationary generation of current. The turbine blades, but also combustion chamber elements, have a metallic protective layer for corrosion and/or oxidation protection and, in especially hot regions, a ceramic heat insulation layer.

Depending on the component geometry, which changes as a result of the design, or another coating materials or coating methods, the coating parameters have to be checked and optimized.

This may, of course, take place in that an entire component is coated and the adhesion of the layers to the substrate of the component and the adhesion of the layers to one another are investigated by the component being destroyed, that is to say being cut through completely, and by the cut surfaces being investigated by metallography. This, however, leads to the total loss of the component.

It is also known to solder, adhere or weld coupons or wafers onto the surface of the component and to check the coating parameters.

SUMMARY OF INVENTION

The object of the invention, therefore, is to improve the above-mentioned coating method. The object is achieved by means of a method according to the claims, in which a coupon is thus introduced into a depression of the component, and by means of a component according to the claims.

The subclaims list further advantageous measures which may be combined with one another, as desired, in order to achieve further advantages.

BRIEF DESCRIPTION OF THE DRAWINGS

In the drawing:
FIG. 1 shows a procedure in the coating method according to the prior art,
FIGS. 2 and 4 show an arrangement for the coating method of the present application,
FIG. 3 shows diagrammatically the sequence of a coating method,
FIG. 7 shows a turbine blade in perspective,
and
FIG. 8 shows a combustion chamber in perspective.

DETAILED DESCRIPTION OF INVENTION

Figure 5:
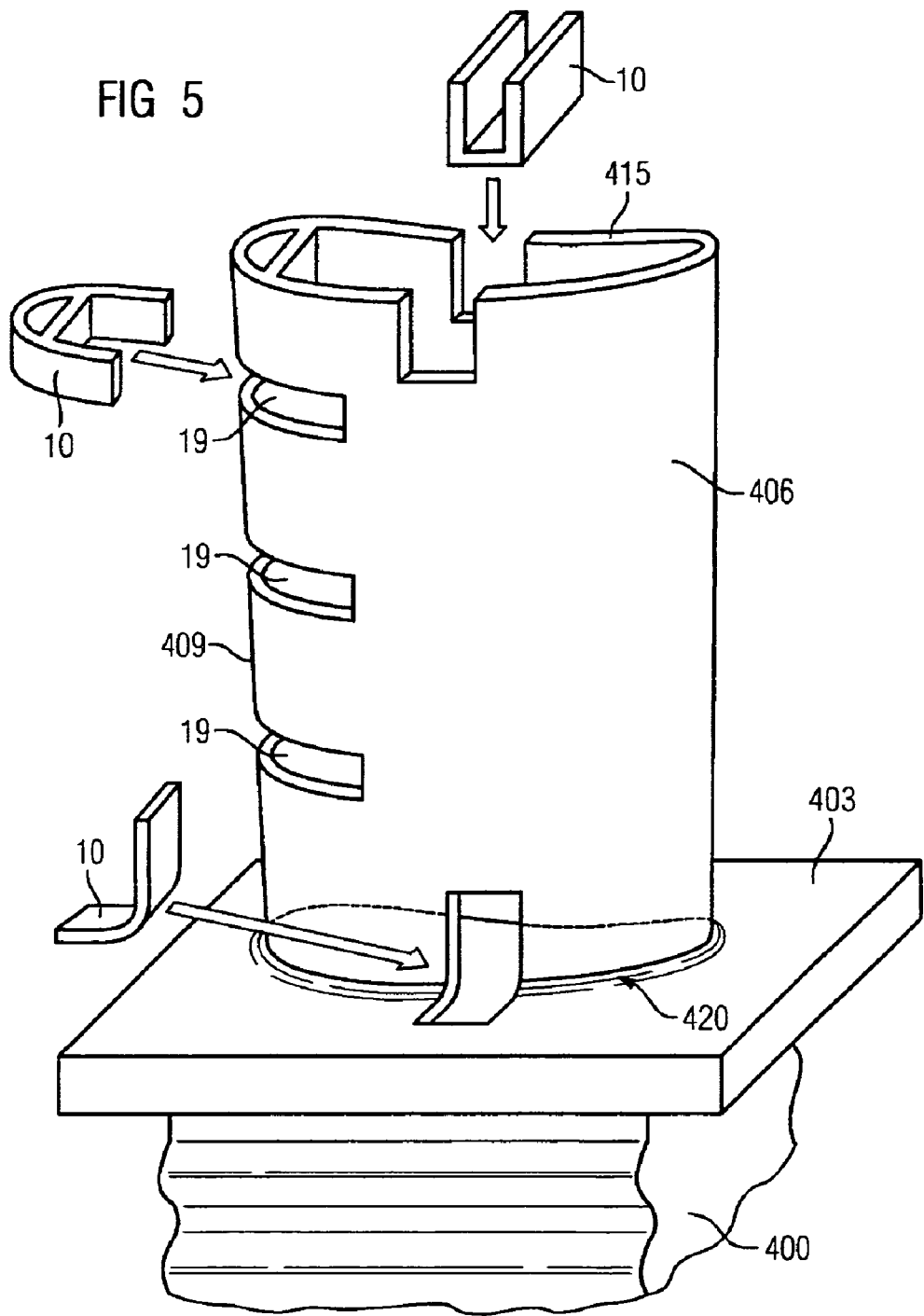
FIG. 5 shows forms of the coupon.

FIG. 1 shows a component 1 or a turbine blade 120, 130 which has a surface 4 in the blade leaf region 406 (FIG. 5), the blade leaf region 406 being coated. In this case, according to the prior art, a coupon 7 is soldered onto the blade tip 415. These projects from the outer surface 4 of the component 1 contrary to the desired geometry of the component 1. Since, according to the prior art, the coupon 7 projects from the surface 4 and this surface is relatively small in relation to the surface to be coated, the marginal effects at the edges of the coupon can influence the adhesion of the layer to the coupon 7. Moreover, the spacing of the turbine surface 20 is also thereby reduced, so that the spacing in the coating of a component without coupons is not the same at the location where the coupon was.

FIG. 2 shows an arrangement with a coupon 10 which overcomes the problems according to the prior art.

A depression 19 is introduced into the component 1, 120, 130, 155. This depression 19 has arranged in it a coupon 10, so that the surface 5 of the latter is, in particular, at the same height as the surrounding surface 4 of the component 1, 120, 130, 155. The coupon 10 may be clamped in mechanically or be fastened by means of weld spots 13. The coupon 5 may likewise be soldered in. A high-temperature adhesive may also be used, which withstands the coating temperatures, but not necessarily the higher temperatures of use of the component.

Preferably, the material of the coupon 10 consists of the same material as the substrate of the component 1, 120, 130, 155.

The figures illustrate the depression 19 as a blind hole, but the depression may also be a through hole, and therefore the term "depression 19" may apply both to blind holes and to through holes.

FIG. 3 shows the sequence of the coating method diagrammatically from left to right.

The arrangement according to FIG. 2, to which material 16 is applied, is shown on the left. Particularly in the case of turbine blades 120, 130, the material is a metallic MCrAlX alloy and/or a ceramic heat insulation layer on top of this.

It can be seen on the right side in FIG. 3 that the coating 16 is present on the surface of the coupon 10 and there are no height differences with respect to a component 1, 120, 130, 155 in which there is no depression having a coupon. This is also accomplished in that the gap between the coupon 10 of the depression 19 and the surrounding substrate 6 is very small, so that impinging material cannot even enter this gap or the gap is closed very quickly with little material. The coupon 10 can be employed in various coating methods. These are low-temperature spraying methods, such as cold-gas spraying or HVOF, thermal spraying methods, such as all plasma spraying methods (VPS, APS, LPPS, etc) and also PVD or CVD methods or an EB-PVD method.

After coating, the coupons 10 can easily be removed together with the coating, since they were only clamped in mechanically or fastened by means of 1, 2 or 3 coating spots 13, 13'. This coupon 10 can be investigated destructively by metallography. The component 1, 120, 130, 155 may preferably have a plurality of coupons 10.

The component 1, 120, 130, 155, which, after coating, likewise has a coating in the same way as the coupon 10, can be used again in that the coating 16 is removed, a new coupon is soldered into the depression 19 and further test series are carried out with the same component. Likewise, in the case of a new test series at another location, a new depression 19 can be formed and the depression previously used can be soldered shut.

It is likewise possible, in a first step for the optimization of coating parameters of a component 1, 120, 130, 155, to use a corresponding component without a depression, in which a piece of the component having coatings 16 is then cut out at the relevant locations, such as, for example, the leading edge, trailing edge, curved regions, as shown in FIG. 5, the location thus cut out corresponding to the depression 19 which can then be correspondingly coated together with a coupon in a further optimization step. In particular, this type of introduction of coupons is relevant in regions of a component which are particularly sharply curved, such as, for example, a leading edge 409 or trailing edge 412 or a turbine blade 120, 130 at the blade tip 415.

A coupon 10 may also be introduced into a depression 19 and, where appropriate, be reworked together with the component 1, 120, 130, 155, so that its surface 5 is at the same height as the surrounding surface 4 of the component 1, 120, 130, 155. Preferably, the outer geometry of the component 1, 120, 130, 155 with a coupon 10 has the same geometry as the component without a coupon 10 or depression 19.

In FIG. 4, the coupon 10 is leant against one side 21 of the depression 19 and is held in the depression 19 on the other side 20 of the depression 19 by means of a connection point 13 by a solder, weld spot or adhesive.

FIG. 5 shows various locations where a coupon is present.

This may be in the region of the leading edge 409, even the inner geometry of the coupon conforming to the geometry within the blade.

The coupon 10, which is introduced in the region of the leading edge 409, is of U-shaped design and preferably extends from the delivery side via the leading edge onto the suction side. It would likewise be possible to attach the coupon either only on the suction side or only on the delivery side.

In the region of the blade tip 415, too, a U-profile may be introduced, which extends, in particular, from the suction side as far as the delivery side. A further location where a turbine blade has a curved region is the region of the blade leaf 406 to the blade platform 403. A curved coupon 10 may also be present at this transition 420.

Figure 6:
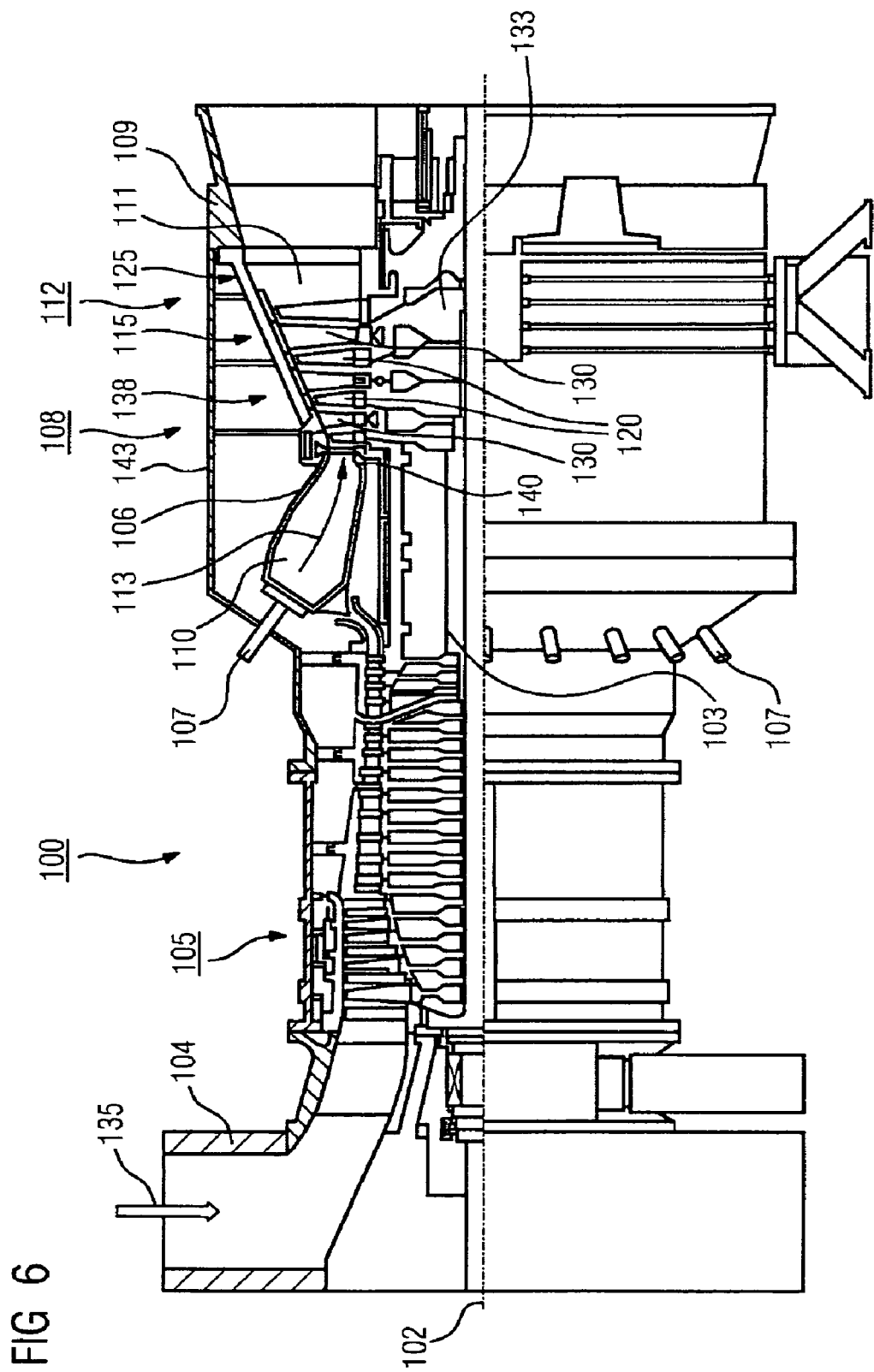
FIG. 6 shows a gas turbine.

FIG. 6 shows a gas turbine 100 by way of example in a part longitudinal section.

The gas turbine 100 has inside it a rotor 103 rotary-mounted about an axis of rotation 102 and having a shaft 101, said rotor also being designated as a turbine rotor.

An intake casing 104, a compressor 105, a, for example, toroidal combustion chamber 110, in particular annular combustion chamber, with a plurality of coaxially arranged burners 107, a turbine 108 and the exhaust gas casing 109 succeed one another along the rotor 103. The annular combustion chamber 110 communicates with a, for example, annular hot gas duct 111. There, for example, four turbine stages 112 connected one behind the other form the turbine 108. Each turbine stage 112 is formed, for example, from two blade rings. A guide vane row 115 is followed, as seen in the direction of flow of a working medium 113, in the hot gas duct 111 by a row 125 formed from moving blades 120.

The guide vanes 130 are in this case fastened to an inner casing 138 of a stator 143, whereas the moving blades 120 of a row 125 are attached to the rotor 103, for example, by means of a turbine disk 133. A generator or a working machine (not illustrated) is coupled to the rotor 103.

While the gas turbine 100 is in operation, air 135 is sucked in by the compressor 105 through the intake casing 104 and is compressed. The compressed air provided at the turbine-side end of the compressor 105 is routed to the burners 107 and is mixed there with a fuel. The mixture is then burnt in the combustion chamber 110 so as to form the working medium 113. The working medium 113 flows from there along the hot gas duct 111 past the guide vanes 130 and the moving blades 120. At the moving blades 120, the working medium 113 expands so as to transmit a pulse, so that the moving blades 120 drive the rotor 103 and the latter drives the working machine coupled to it.

The components exposed to the hot working medium 113 are subject to thermal loads while the gas turbine 100 is in operation. The guide vanes 130 and moving blades 120 of the first turbine stage 112, as seen in the direction of flow of the working medium 113, are subjected to the most thermal load, in addition to the heat shield elements lining the annular combustion chamber 110. In order to withstand the temperatures prevailing there, these may be cooled by means of a coolant. Substrates of the components may also have a directional structure, that is to say they are monocrystalline (SX structure) or have only longitudinally directed grains (DS structure). Materials which may be used for the components, in particular for the turbine blade 120, 130 and components of the combustion chamber 110, are, for example, iron-, nickel- or cobalt-based superalloys.

Such superalloys are known, for example, from EP 1 204 776 B1, EP 1 306 454, EP 1 319 729 A1, WO 99/67435 or WO 00/44949; these publications are part of the disclosure with respect to the chemical composition of the alloys.

The blades 120, 130 may also have coatings against corrosion (MCrAlX; M is at least one element of the group iron (Fe), cobalt (Co), nickel (Ni), X is an active element and stands for yttrium (Y) and/or silicon, scandium (Sc) and/or at least one rare earth element or hafnium). Such alloys are known from EP 0 486 489 B1, EP 0 786 017 B1, EP 0 412 397 B1 or EP 1 306 454 A1 which are to be part of this disclosure with respect to the chemical composition. On the MCrAlX, a heat insulation layer may also be present and consists, for example, of $ZrO_2$, $Y_2O_3$—$ZrO_2$, that is to say it is not or is partially or completely stabilized by yttrium oxide and/or calcium oxide and/or magnesium oxide. By means of suitable coating methods, such as, for example, electron beam vapor deposition (EB-PVD), columnar grains are generated in the heat insulation layer.

The guide vane 130 has a guide vane root (not illustrated here) facing the inner casing 138 of the turbine 108 and a guide vane head lying opposite the guide vane root. The guide vane head faces the rotor 103 and is secured to a fastening ring 140 of the stator 143.

FIG. 7 shows a perspective view of a moving blade 120 or guide vane 130 of a turbo machine, which extends along a longitudinal axis 121.

The turbo machine may be a gas turbine of an aircraft or of a power station for electricity generation, a steam turbine or a compressor.

The blade 120, 130 has successively along the longitudinal axis 121 a fastening region 400, a blade platform 403 contiguous to the latter and also a blade leaf 406 and a blade tip 415. As a guide vane 130, the blade 130 may have a further platform (not illustrated) at its blade tip 415.

In the fastening region 400, a blade root 183 is formed, which serves (not illustrated) for fastening the moving blades 120, 130 to a shaft or a disk. The blade root 183 has, for example, a hammer head configuration. Other configurations as a pine tree or dovetail root are possible. For a medium which flows past the blade leaf 406, the blade 120, 130 has a leading edge 409 and a trailing edge 412.

In conventional blades 120, 130, for example, solid metallic materials, in particular superalloys, are used in all regions 400, 403, 406 of the blade 120, 130.

Such superalloys are known, for example, from EP 1 204 776 B1, EP 1 306 454, EP 1 319 729 A1, WO 99/67435 or WO 00/44949; these publications are part of the disclosure with respect to the chemical composition of the alloy. The blade 120, 130 may in this case be manufactured by a casting method, also by means of directional solidification, by a forging method, by a milling method or by combinations of these.

Workpieces with a monocrystalline structure or structures are used as components for machines which are exposed to high mechanical, thermal and/or chemical loads during operation. The manufacture of monocrystalline workpieces of this type takes place, for example, by directional solidification from the melt. This involves casting methods in which the liquid metallic alloy solidifies into the monocrystalline structure, that is to say into the monocrystalline workpiece, or directionally. In this case, dendritic crystals are oriented along the heat flow and form either a columnar-crystalline grain structure (columnar, that is to say grains which run over the entire length of the workpiece and here, according to general linguistic practice, are designated as being directionally solidified) or a monocrystalline structure, that is to say the entire workpiece consists of a single crystal. These methods must avoid the transition to globulitic (polycrystalline) solidification, since transverse and longitudinal grain boundaries are necessarily formed as a result of undirected growth and nullify the good properties of the directionally solidified or monocrystalline component. When directionally solidified structures are referred to in general terms, these mean both monocrystals which have no grain boundaries or at most low-angle grain boundaries and columnar crystal structures which, although having grain boundaries running in the longitudinal direction, have no transverse grain boundaries. With regard to the second-mentioned crystalline structures, directionally solidified structures are also referred to. Such methods are known from U.S. Pat. No. 6,024,792 and EP 0 892 090 A1; these publications are part of the disclosure in respect of the solidification method.

The blades 120, 130 may likewise have coatings against corrosion or oxidation, for example (MCrAlX; M is at least one element of the group iron (Fe), cobalt (Co), nickel (Ni), X is an active element and stands for yttrium (Y) and/or silicon and/or at least one rare earth element or hafnium (Hf)). Such alloys are known from EP 0 486 489 B1, EP 0 786 017 B1, EP 0 412 397 B1 or EP 1 306 454 A1 which are to be part of this disclosure in respect of the chemical composition of the alloy. The density preferably lies at 95% of the theoretical density. A protective aluminum oxide layer (TGO=thermal grown oxide layer) forms on the MCrAlX layer (as an intermediate layer or as the outermost layer).

On the MCrAlX, a heat insulation layer may also be present, which is preferably the outermost layer and consists, for example, of $ZrO_2$, $Y_2O_3$—$ZrO_2$, that is to say it is not or is partially or completely stabilized by yttrium oxide and/or calcium oxide and/or magnesium oxide. The heat insulation layer covers the entire MCrAlX layer.

By means of suitable coating methods, such as, for example, electron beam vapor deposition (EB-PVD), columnar grains are generated in the heat insulation layer.

Other coating methods may be envisaged, for example atmospheric plasma spraying (APS), LPPS, VPS or CVD. The heat insulation layer may have porous microcrack or macrocrack compatible grains for better thermal shock resistance. The heat insulation layer is therefore preferably more porous than the MCrAlX layer.

Refurbishment means that components 120, 130, have to, after use, where appropriate, be freed of protective layers (for example, by sandblasting). A removal of the corrosion and/or oxidation layers or products then takes place. If appropriate, cracks in the component 120, 130 are also repaired. This is followed by a recoating of the component 120, 130 and a renewed use of the component 120, 130.

The blade 120, 130 may be of hollow or solid design. If the blade 120, 130 is to be cooled, it is hollow and, if appropriate, also has film cooling holes 418 (indicated by dashes).

FIG. 8 shows a combustion chamber 110 of a gas turbine. The combustion chamber 110 is configured, for example, as what is known as an annular combustion chamber, in which a multiplicity of burners 107 arranged around an axis of rotation 102 in the circumferential direction issue into a common combustion chamber space 154 and generate flames 156. For this purpose, the combustion chamber 110 is configured as a whole as an annular structure which is positioned around the axis of rotation 102.

To achieve a comparatively high efficiency, the combustion chamber 110 is designed for a comparatively high temperature of the working medium M of about 1000° C. to 1600° C. In order to allow a comparatively long operating time even in the case of these operating parameters which are unfavorable for the materials, the combustion chamber wall 153 is provided on its side facing the working medium M with an inner lining formed from heat shield elements 155. Each heat shield element 155 consisting of an alloy is equipped on the working medium side with a particularly heat-resistant protective layer (MCrAlX layer and/or ceramic coating) or is manufactured from material resistant to high temperature (solid ceramic bricks). These protective layers may be similar to those of the turbine blades, that is to say, for example, MCrAlX means: M is at least one element of the group iron (Fe), cobalt (Co), nickel (Ni), X is an active element and stands for yttrium (Y) and/or silicon and/or at least one rare earth element or hafnium (Hf). Such alloys are known from EP 0 486 489 B1, EP 0 786 017 B1, EP 0 412 397 B1 or EP 1 306 454 A1 which are to be part of this disclosure in respect of the chemical composition of the alloy.

On the MCrAlX, a, for example, ceramic heat insulation layer may also be present and consists, for example, of $ZrO_2$, $Y_2O_3$—$ZrO_2$, that is to say it is not or is partly or completely stabilized by yttrium oxide and/or calcium oxide and/or magnesium oxide.

By means of suitable coating methods, such as, for example, electron beam vapor deposition (EB-PVD), columnar grains are generated in the heat insulation layer.

Other coating methods may be envisaged, for example atmospheric plasma spraying (APS), LPPS, VPS or CVD. The heat insulation layer may have porous microcrack or macrocrack compatible grains for better thermal shock resistance.

Refurbishment means that heat shield elements 155, after use, must, where appropriate, be freed of protective layers (for example, by sand blasting). A removal of the corrosion and/or oxidation layers or products then takes place. If appropriate, cracks in the heat shield element 155 are also repaired. This is followed by a recoating of the heat shield elements 155 and a renewed use of the heat shield elements 155. Moreover, on account of the high temperatures inside the combustion chamber 110, a cooling system may be provided for the heat shield elements 155 or for their holding elements. The heat shield elements 155 are then, for example, hollow and, if appropriate, also have cooling holes (not illustrated) issuing into the combustion chamber space 154.

The invention claimed is:

1. A method for optimizing a plurality of coating method parameters of a component having a surface comprising:
   introducing a depression into the component;
   providing a coupon;
   arranging the coupon in the depression;
   coating the coupon in the depression with a coating material; and
   investigating the coupon after the coating is applied.

2. The method as claimed in claim 1, wherein an outer free surface, a surface that is not adjacent to a side of the depression, of the coupon is at a same height in the depression as a surface of the component in an area surrounding the coupon.

3. The method as claimed in claim 1, wherein a same material is used for the coupon as for the component.

4. The method as claimed in claim 1, wherein the coupon is soldered in the depression, or the coupon is welded in the depression, or the coupon is clamped in the depression mechanically.

5. The method as claimed in claim 4, wherein a gap in the depression between the coupon and the component is not completely soldered shut or welded shut.

6. The method as claimed in claim 5, wherein the coupon is fastened in the depression at two to four locations.

7. The method as claimed in claim 1, wherein a coating method is selected from the group consisting of low-temperature spraying methods, thermal spraying methods, and thin-film coating methods.

8. The method as claimed in claim 1, wherein the coupon is arranged in one of a plurality of regions of the component which are sharply curved.

9. The method as claimed in claim 1, wherein the component with the coupon has a same outer geometry as a further component without the coupon and without the depression.

10. The method as claimed in claim 9, wherein the coupon is introduced in the depression and subsequently machined into the depression of the component, in order to adapt a surface of the coupon to a surrounding surface of the component, whereby there is no longer a projection present between the coupon and the component.

11. The method as claimed in claim 1, wherein the coated coupon is detached and investigated after being detached.

12. The method as claimed in claim 11, further comprising,
   detaching the coated coupon together with a coating,
   removing the coating from the component when the coupon is removed from the component, and
   introducing a new coupon into the depression for coating.

13. The method as claimed in claim 1, wherein a plurality of coupons are present on the component.

14. A component, comprising:
   a depression; and
   a coupon, which is fastened into the component; a surface, wherein the coupon is arranged in the depression, wherein the coupon is coated in the depression with a coating material, and wherein the coupon is investigated after the coating is applied.

15. The component as claimed in claim 14, wherein the coupon is located in a sharply curved region.

16. The component as claimed in claim 15, wherein the coupon is located in and/or around the leading edge of a turbine blade or in and/or around the trailing edge of a turbine blade.

17. The component as claimed in claim 14, wherein the coupon is located in a blade tip.

18. The component as claimed in claim 14, wherein the fastening of the coupon in the depression does not withstand a mechanical and/or a thermal load during a period of use and under a plurality of conditions of use of the component.

19. The component as claimed in claim 14, wherein the component is a component of a turbine.

20. The component as claimed in claim 14, wherein the component with the coupon has a same outer geometry as the component without the coupon or without the depression.

* * * * *